United States Patent [19]
Kimura

[11] Patent Number: 5,933,104
[45] Date of Patent: Aug. 3, 1999

[54] METHOD AND SYSTEM FOR COMPRESSION AND DECOMPRESSION USING VARIABLE-SIZED OFFSET AND LENGTH FIELDS

[75] Inventor: Gary D. Kimura, Kirkland, Wash.

[73] Assignee: Microsoft Corporation, Redmond, Wash.

[21] Appl. No.: 08/827,926

[22] Filed: Nov. 22, 1995

[51] Int. Cl.[6] .................................................. H03M 7/00
[52] U.S. Cl. .............................................. 341/87; 341/51
[58] Field of Search ................................. 341/50, 51, 87, 341/65, 67, 106, 107

[56] References Cited

U.S. PATENT DOCUMENTS

| | | | |
|---|---|---|---|
| 5,003,307 | 3/1991 | Whitting et al. | 341/51 |
| 5,016,009 | 5/1991 | Whitting et al. | 341/67 |
| 5,049,881 | 9/1991 | Gibson et al. | 341/95 |
| 5,051,745 | 9/1991 | Katz | 341/51 |
| 5,126,739 | 6/1992 | Whitting et al. | 341/106 |
| 5,140,321 | 8/1992 | Jung | 341/55 |
| 5,455,577 | 10/1995 | Slivka et al. | 341/51 |
| 5,532,694 | 7/1996 | Mayers et al. | 341/67 |
| 5,572,206 | 11/1996 | Miller et al. | 341/51 |

OTHER PUBLICATIONS

Ziv, J. et al., "A Universal Algorithm for Sequential Data Compression," *IEEE Transactions on Information Theory* IT–23:337–343 (1997).

Ziv, J. et al., "Compression of Individual Sequences via Variable-Rate Coding," *IEEE Transactions on Information Theory* IT–24:530–536 (1978).

*Primary Examiner*—Marc Hoff
*Assistant Examiner*—Peguy JeanPierre
*Attorney, Agent, or Firm*—Christensen O'Connor Johnson & Kindness PLLC

[57] ABSTRACT

A computer system includes a compression engine for compressing a decompressed sequence of data to produce a compressed sequence of data. The compression engine encodes each piece of data in the decompressed sequence of data as either a portion of a copy token or as a literal token. Tokens are grouped together into groups of up to 8 tokens and a bitmap holding 8 bits is provided to identify the respective tokens as either copy tokens or literal tokens. The copy tokens encode sub-sequences of data that have previously occurred in the decompressed data sequence. Each copy token is of a like size but includes a variable-sized offset field for encoding an offset between a current occurrence of a sub-sequence of data and a previous occurrence of a sub-sequence of data. The offset field is variable-sized to encode the offset in a minimal number of bits. The computer system also includes a decompression engine for decompressing data sequences that have been compressed using the compression engine.

34 Claims, 15 Drawing Sheets

METHOD AND SYSTEM FOR COMPRESSION AND DECOMPRESSION USING VARIABLE-SIZED OFFSET AND LENGTH FIELDS

TECHNICAL FIELD

The present invention relates generally to computer systems and,. more particularly, compression and decompression techniques that are used in computer systems.

BACKGROUND OF THE INVENTION

The LZRW1 compression algorithm was proposed by Ross N. Williams to increase the performance of the LZ77 class of compression algorithms. (The basic LZ77 algorithm is described in J. Ziu and A. Lempel, "A Universal Algorithm for Sequential Data Compression, *Transactions on Information Theory,* Vol. 23, No. 3, May 1977, pp. 337–343). The LZRW1 algorithm uses the single pass literal/copy mechanism of the LZ77 class of algorithms to compress an uncompressed data sequence into a compressed data sequence. Bytes of data in the uncompressed data sequence are either directly incorporated into a compressed data sequence as a string (i.e., as "literal items") or, alternatively, are encoded as a pointer to a matching set of data that has already been incorporated into the compressed data sequence (i.e., as "copy items"). The copy items are encoded by offset and length values that require fewer bits than the bytes of data. The offset specifies the offset of the string being coded relative to its previous occurrence. For example, if a string of three characters occurred six bytes before the occurrence that is being encoded, the offset is six. The length field specifies the length of the matching data sequence in bytes. Compression is realized by representing as much of the uncompressed data sequence as possible as copy items. Literal items are incorporated into the compressed data sequence only when a match of three or more bytes cannot be found.

FIG. 1 depicts an example of the operation of the LZRW1 data compression algorithm. The uncompressed data sequence is stored in an input block 10 that is a read only data structure. The input block 10 includes a history or "Lempel" portion 12 that holds the most recent 4,095 bytes of history that immediately precede the current position, as indicated by pointer 18 in the input block 10. The 16 bytes of the remaining portion of the input block 10 to be processed constitute the "Ziv" 14 portion of the input block. The Lempel portion 12 and the Ziv portion are separated by a Lempel/Ziv boundary 33. The current position pointer 18 points to the first character in the bytes that are currently being processed. The portion 16 of the input block 10 that lies to the left of the current position pointer 18 has been fully processed. The LZRW1 compression algorithm uses a hash function 26 and a hash table 28. The role of the hash function 26 and the hash table 28 will be described in more detail below.

FIG. 2 is a flowchart that shows the high level steps that are performed by the LZRW1 data compression algorithm. First, a hash for the next three bytes 22 that are to be processed in the input block is generated using the hash function 26. The next three bytes are those that immediately follow the current position pointer 18. In the example shown in FIG. 1, the next three bytes 22 are "cab" (assuming that each character is encoded by a byte length encoding). The hash of the three bytes 22 is generated using the hash function 26 (see step 34 in FIG. 2). The resulting hash serves as an index into the hash table 28, and is used to index an entry 30 within the hash table (step 36 in FIG. 2). The pointer 32 is remembered temporarily and the hash table entry 30 is updated to hold a pointer to the beginning of the Ziv portion 14 (step 38 in FIG. 2).

A determination is then made to determine whether the fetched pointer 32 that was retrieved from the hash table entry 30 points to a location within the Lempel portion 12 and points to a match with the 3 bytes in the Ziv (step 40 in FIG. 2). In the example shown in FIG. 1, the pointer 32 points to a location within the Lempel portion 12 and matches. As such, the three bytes 22 are encoded as a copy item (step 42 in FIG. 2). If, however, the pointer 32 does not point within the Lempel portion 12, the three bytes 22 are encoded as literal items (step 44 in FIG. 2). The Lempel/Ziv boundary 33 and current position pointer 18 are shifted accordingly (step 46 in FIG. 2). If the three bytes 22 are encoded as a copy item, the Lempel/Ziv boundary is shifted to lie immediately after the last byte that was encoded by the copy item. On the other hand, if the encoding is for a literal item, only a single byte (i.e., the byte pointed to by the current position, pointer 18) is encoded, and the Lempel/Ziv boundary 33 is shifted to lie immediately after that character. For example, if the character "c" were to be encoded as a literal item for the three bytes 22, the Lempel/Ziv boundary 33 would be shifted towards the end of the input buffer 10 by one character in FIG. 1. The system then checks whether it is done processing input (step 48 in FIG. 2). The algorithm is completed when all of the characters in the input buffer 10 have been processed.

FIG. 3 is a block diagram that illustrates the format of the compressed data block 50 that results from applying the LZRW1 compression algorithm. Specifically, the compressed data block 50 that results from application of the LZRW1 compression algorithm is divisible into code words (CW) 52 followed by literal and copy items 54. Each code word 52 holds 16 bits of flags that indicate whether an associated item in the items 54 that follow the code word is encoded as a literal item or as a copy item. A zero value for a bit in the code word indicates that the associated item is a literal item. A one value for a bit in the code word indicates that the associated item is a copy item. Thus, it can be seen from FIG. 3, that the compressed data sequence 50 consists of a sequence of 16 bit code words 52 and 16 associated items 54.

FIG. 4A illustrates the format of a literal item 56. A literal item holds literal data and is a byte in length. A copy item 57 (FIG. 4B), in contrast, is two bytes in length and holds a first byte 58A that is divisible in half into an "a" field and a "b" field. The second byte 58B holds a "c" field. These two bytes 58A and 58B are used to hold values that encode the length and offset. The value of the length is encoded in the "b" field. The length of the matching data sequence is calculated as the value held in the "b" field plus one. The offset is calculated as 256 times the value held in the "a" field plus the value held in the "c" field. The resulting range of offsets is between 1 and 4,095.

SUMMARY OF THE INVENTION

The present invention recognizes that all of the bits allocated to the offset field by LZRW1 are not always needed and as such, allocating all of the bits may constitute a waste of memory space. The present invention eliminates this waste by using an approach that uses variable-sized length and offset fields in copy tokens.

In accordance with one aspect of the present invention a method of compressing a decompressed sequence of data is practiced in a computer system. Per the method, a pattern of data that is located at a given location that decompresses a sequence of data is identified. The pattern of data also occurs earlier in the sequence at a previous location. The pattern of data is encoded as a copy token that has a fixed number of bits. The copy token includes an offset field that identifies the offset between the pattern of data at the given location and the previous location at which the patterns of data have occurred. Then the number of bits that are included in the offset field depends upon the location of the pattern of data in the sequence of data. The number of bits may equal a minimum number of bits that are required to encode an offset from the given location of the pattern of data to a start of the decompressed sequence of data. The copy token may also include a length field that specifies the length of the pattern of data.

In accordance with another aspect of the present invention a method is practiced for compressing a file of data in a computer system. The file is divided into decompressed chunks and each chunk is separately compressed. Each chunk is compressed by sequentially examining a sub-sequence of the data in the decompressed chunk. Each sub-sequence of data that has previously occurred in the decompressed chunk is encoded as a copy token of a predetermined fixed length. Each copy token includes an offset field that specifies an offset between occurrences of the sub-sequence and a length field that specifies a length of the sub-sequence. The number of bits that are used in the offset field depend upon a location of a subsequent occurrence of the sub-sequence within the decompressed chunk. Each piece of data that is not encoded as a copy token is encoded as a literal token.

In accordance with an additional aspect of the present invention a method is practiced in a computer system for decompressing a sequence of compressed data. The sequence of compressed data contains copy tokens and literal tokens. Each copy token contains an offset field. The number of bits in the offset field depends upon location of the data that is encoded by the copy token. For each copy token, the system identifies a number of bits in the offset field by determining the location of the copy token. The identified offset field is used to locate the matching sub-sequence of data that is encoded by the copy token. The copy token is then replaced with a matching sub-sequence of data. Each literal token is kept in the sequence of data.

BRIEF DESCRIPTION OF THE DRAWINGS

A preferred embodiment of the present invention will be described below relative to the following figures.

DETAILED DESCRIPTION OF THE INVENTION

The present invention provides an improved approach to compression and decompression for the LZ77 class of algorithms. Uncompressed data is compressed into copy tokens and literal tokens. The copy tokens have variable-sized length and offset fields that change according to a sliding scale based on the location of the bytes being encoded within a fixed-sized uncompressed data chunk. The number of bits allocated to the offset field is set to be equal to the number of bits that are required to identify the maximum offset relative to the current position within the uncompressed data chunk. Compression occurs only within fixed-sized data chunks, and a file may be divided into a number of these fixed-sized chunks so that when the file is compressed, data within one of the chunks may be randomly accessed. Only the chunk that contains the data being sought needs to be decompressed, while the other chunks may remain compressed.

Figure 5:
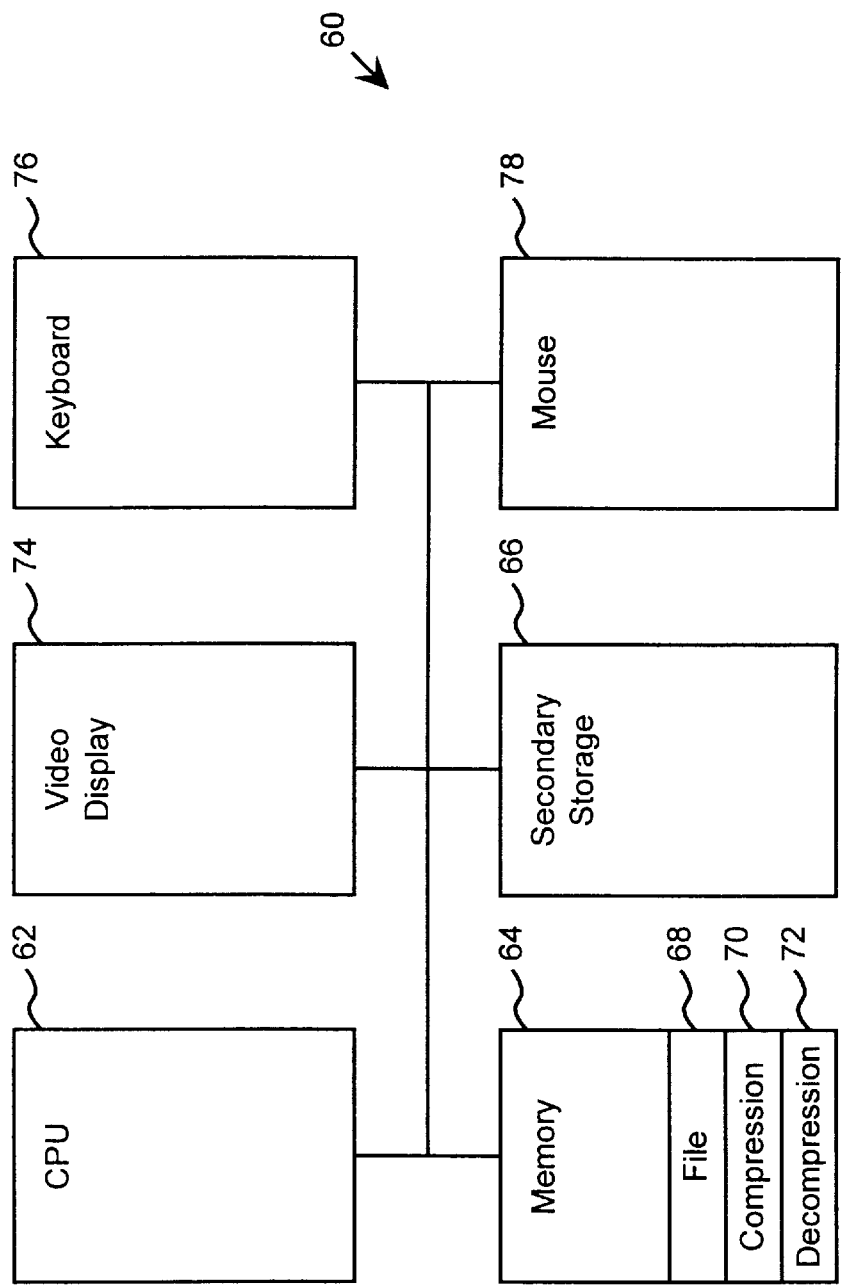
FIG. 5 is a block diagram of a computer system that is suitable for practicing the preferred embodiment of the present invention.

FIG. 5 is a block diagram of a computer system 60 that is suitable for practicing the preferred embodiment of the present invention. The computer system includes a central processing unit (CPU) 62 that has access to a primary memory 64 and a secondary storage 66. The primary memory 64 may hold a file of data 68 that is to be compressed as well as a compression engine 70 and a decompression engine 72. The compression engine 70 is responsible for compressing data into compressed form. Conversely, the decompression engine 72 is responsible for decompressing data that is already in a compressed form. The computer system 60 may also have a number of peripheral devices, including a video display, a keyboard 76 and a mouse 78. Those skilled in the art will appreciate that the computer system 60 shown in FIG. 5 is intended to be merely illustrative and not limiting of the present invention. The present invention may also be practiced with other computer systems, including distributed computer systems.

Figure 6:
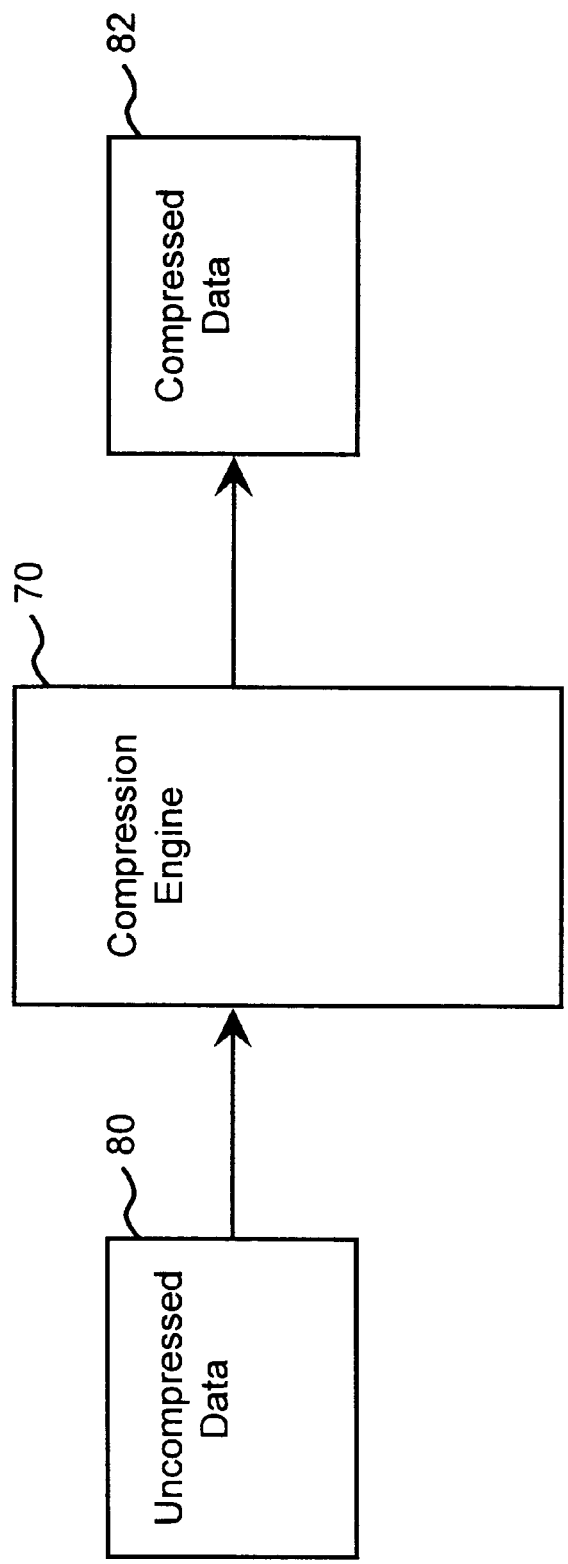
FIG. 6 is a block diagram illustrating functionality performed by the compression engine of the preferred embodiment of the present invention.
Figure 7:
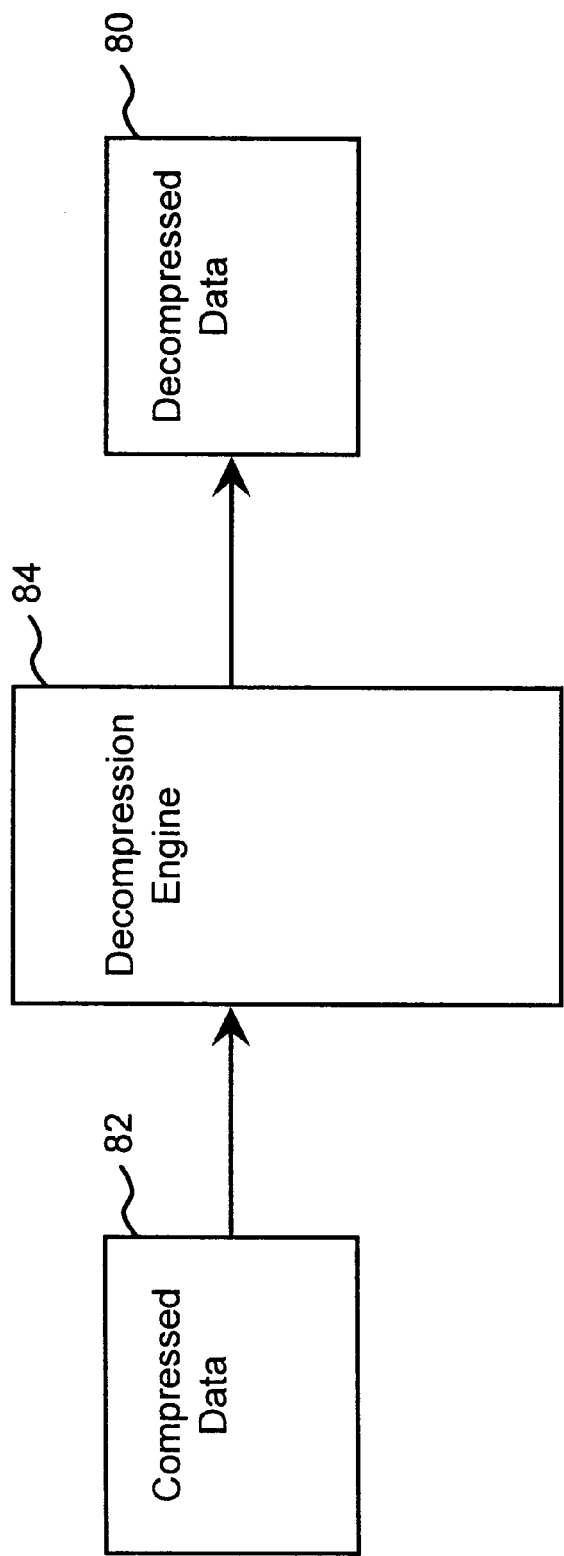
FIG. 7 is a block diagram illustrating the functionality performed by the decompression engine of the preferred embodiment of the present invention.

FIG. 6 is a block diagram that illustrates the functionality performed by the compression engine 70. The compression engine 70 takes decompressed data 80 and compresses the data to produce compressed data 82. The compression of data performed by the compressor engine will be described in more detail below. As FIG. 7 indicates, the decompression engine 84 performs the opposite task. Specifically, as will be described in more detail below, the decompression engine 84 takes compressed data 82 and produces decompressed data 80.

Figure 8:
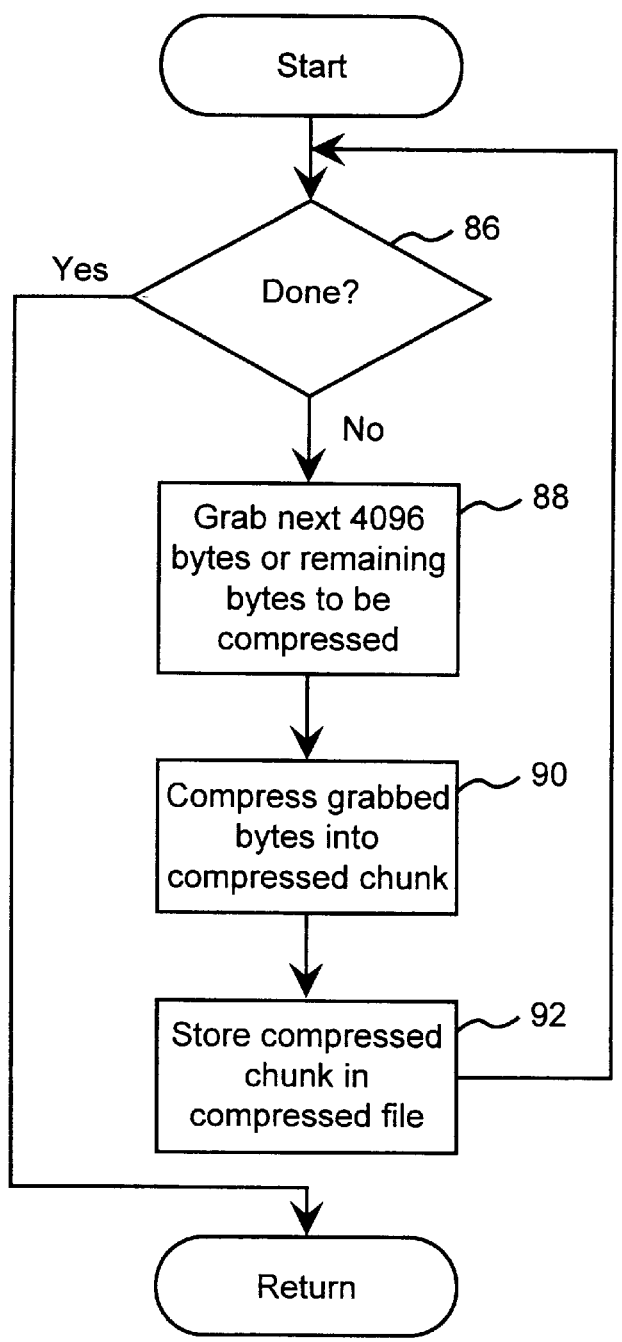
FIG. 8 is a flow chart illustrating the steps that are performed by the preferred embodiment of the present invention in compressing a file into compressed chunks.
Figure 9:
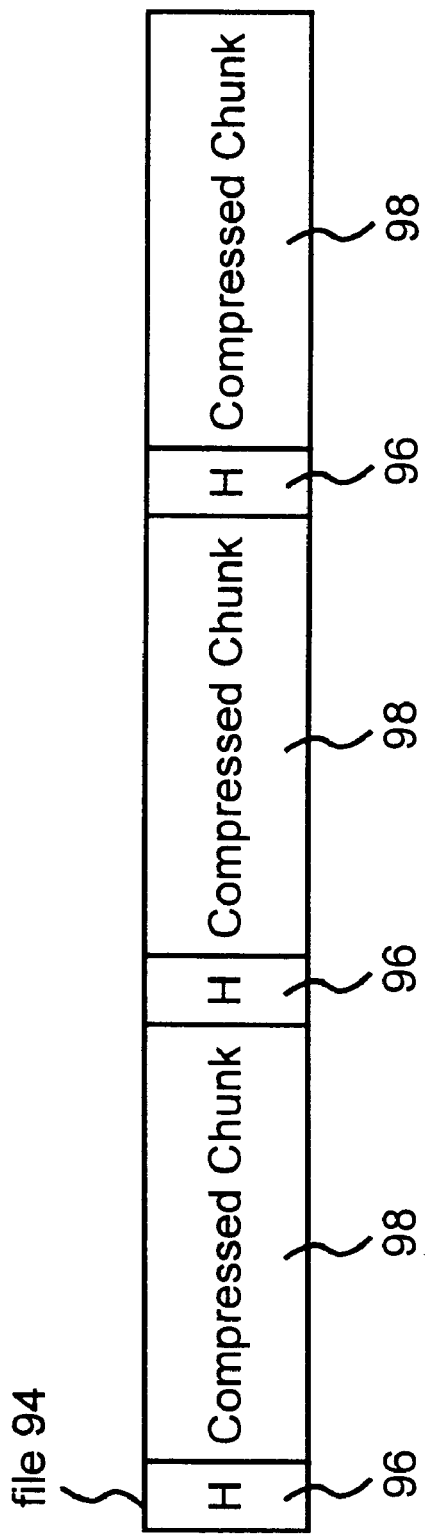
FIG. 9 illustrates the format of resulting file when the steps of FIG. 8 are performed.

As was mentioned above, the preferred embodiment of the present invention operates by dividing files or other data sequences that are to be compressed into blocks of a fixed maximum size. The preferred embodiment of the present invention operates on blocks of 4,096 bytes or less. Those skilled in the art will appreciate that the present invention may alternatively use different block sizes other than 4,096 bytes. FIG. 8 is a high level flowchart indicating the steps that are performed by the preferred embodiment of the present invention to compress such a file of uncompressed data. Initially, the compression engine 70 checks whether there is any data left to be compressed (step 86). The compression engine 70 then grabs the next 4,096 bytes, or the remaining bytes to be compressed if there are less than 4,096 bytes in the file to be compressed (step 88). This block of data is compressed into a compressed chunk (step 90) using an approach that will be described in more detail below. Given that the decompressed chunk is at most 4,096 bytes, the compressed chunk is ensured to be at most 4,096 bytes in length. The compressed chunk is stored in the compressed file (step 92). The process is repeated until all of the chunks of the uncompressed file have been compressed. The resulting compressed file 94 has a format like that shown in FIG. 9. Specifically, the resulting compressed file 94 is a sequence of headers (H) 96 followed by compressed chunks 98.

Figure 10:
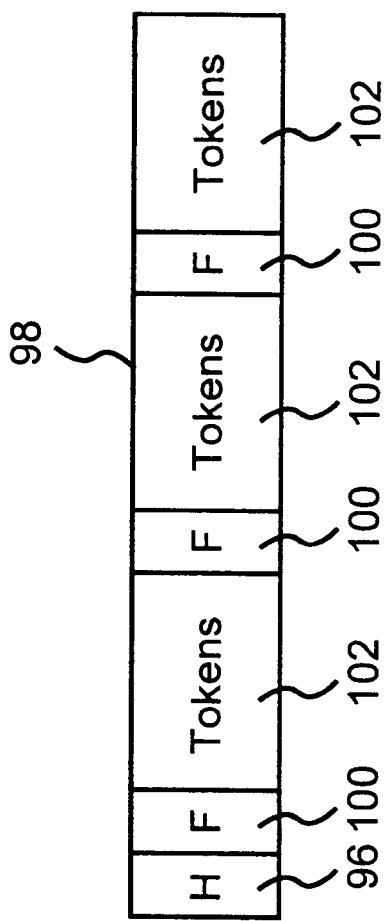
FIG. 10 illustrates in more detail the format of a compressed chunk of FIG. 9.

FIG. 10 shows the header 96 and a portion of the compressed chunk 98 in more detail. The compressed chunk header 96 holds four fields. The first field specifies the size of the compressed chunk 98. The size is specified as a 12 bit value that may range from 0 to 4,095 bytes. The decompressed chunk size field is also stored in the compressed chunk header 96. The decompressed chunk size is a two bit value that stores the size of the decompressed chunk, which may be 512 bytes, 1,024 bytes, 2,048 bytes, or 4,096 bytes, which are encoded by respective values of 0, 1, 2 and 3. A third field holds a flag that indicates whether the chunk is compressed or not. A fourth field holds a bit that is reserved.

Figure 11A:
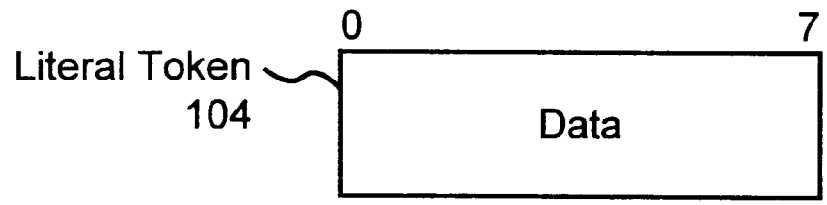
FIG. 11A illustrates the format of a literal token in accordance with the preferred embodiment of the present invention.
Figure 11B:
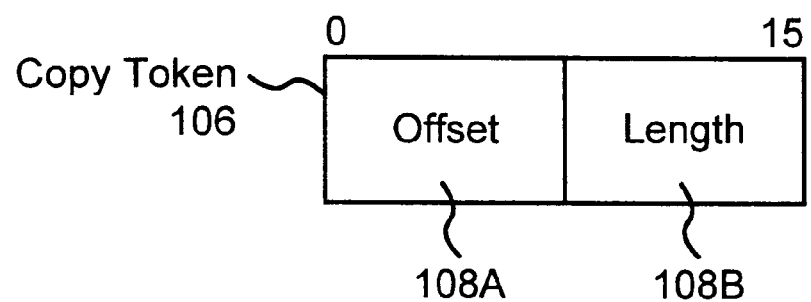
FIG. 11B illustrates the format of a copy token in accordance with the preferred embodiment of the present invention.

As can be seen from FIG. 10, the compressed chunk 98 holds a repeating sequence of flags 100 followed by tokens 102. The flags 100 constitute a byte of bits that are followed by eight tokens 102. Each bit in the flags byte 100 corresponds to a one of the tokens 102. The size of the token is either one byte or two bytes, depending on the value of the flag bit. A zero value for a flag denotes a one byte literal token, and a one value for a flag denotes a two byte copy token. As is shown in FIG. 11A, a literal token 104 is a byte in length and holds the literal data. The copy token 106 (FIG. 11B) is two bytes in length and holds an offset field 108A as well as a length field 108B.

All copy tokens 106 are two bytes in length, but the number of bits that are allocated for the offset field 108A and the length field 108B varies depending upon the location of the string that is to be represented as a copy token. The number of bits that are allocated to the offset field is the minimum necessary to specify an offset to the beginning of the decompressed chunk. The table set forth below summarizes the sliding scale of possible allocations for the offset field 108 and the length field 108B. The first number in the Copy Token Format column specifies the number of bits allocated to the offset field 108A, and the second number (which follows the colon) specifies the number of bits allocated to the length field 108B. The length field has a bias of 3 (since that is the shortest length for a copy token). The matching string may include portions of the Ziv and thus, a largest length match may be 4,098 (i.e., the whole buffer).

| Copy Token Format | Displacement Range | Length Range |
| --- | --- | --- |
| 4:12 | 1–16 | 3–4098 |
| 5:11 | 1–32 | 3–2050 |
| 6:10 | 1–64 | 3–1026 |
| 7:9 | 1–128 | 3–514 |
| 8:8 | 1–256 | 3–258 |
| 9:7 | 1–512 | 3–130 |
| 10:6 | 1–1024 | 3–66 |
| 11:5 | 1–2048 | 3–34 |
| 12:4 | 1–4096 | 3–18 |

One benefit of this approach is that the length bits in the length field 108B are fully used.

Some examples are helpful in illustrating how the sliding scale operates. If the maximum possible offset is within 16 bytes of the start of the decompressed chunk, the copy token uses the 4:12 format. On the other hand, if the maximum possible offset is between 17–32 bytes of the start of the uncompressed chunk, the copy token uses the 5:11 format.

Figure 12:
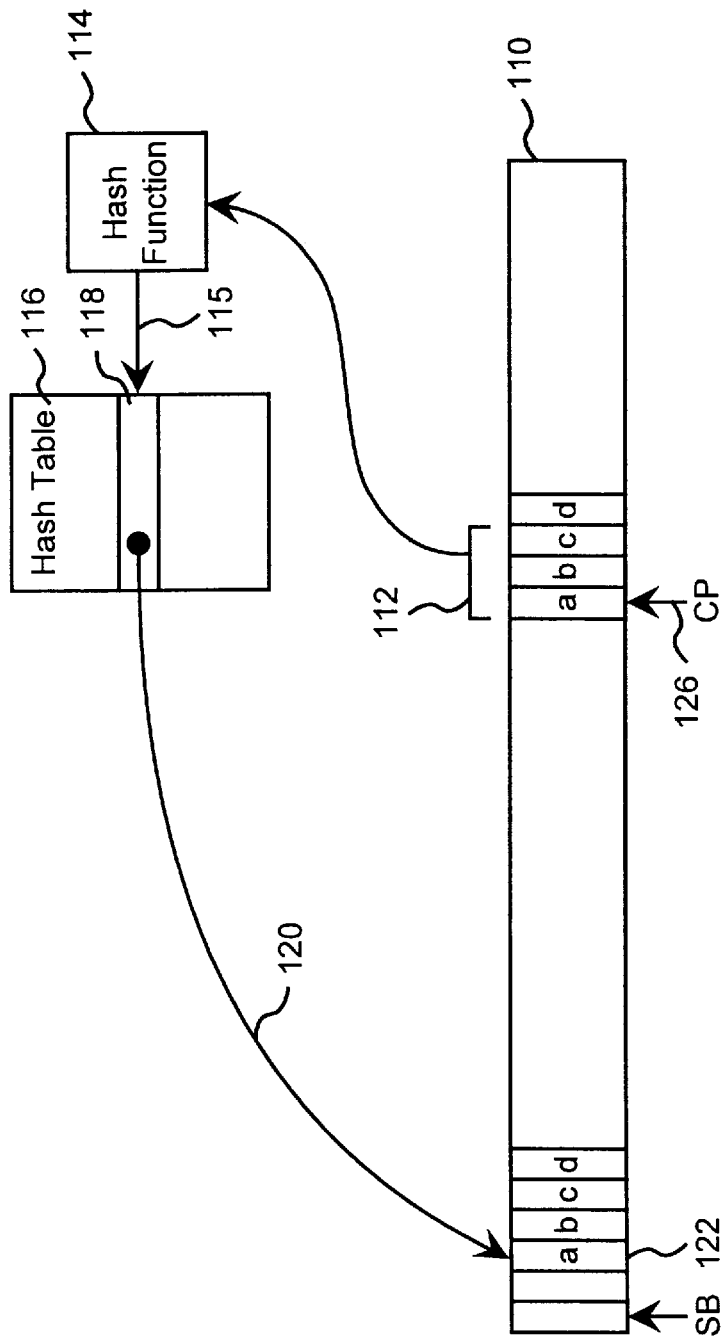
FIG. 12 illustrates an example of the operation of the preferred embodiment of the present invention in compressing a decompressed chunk of data.
Figure 13:
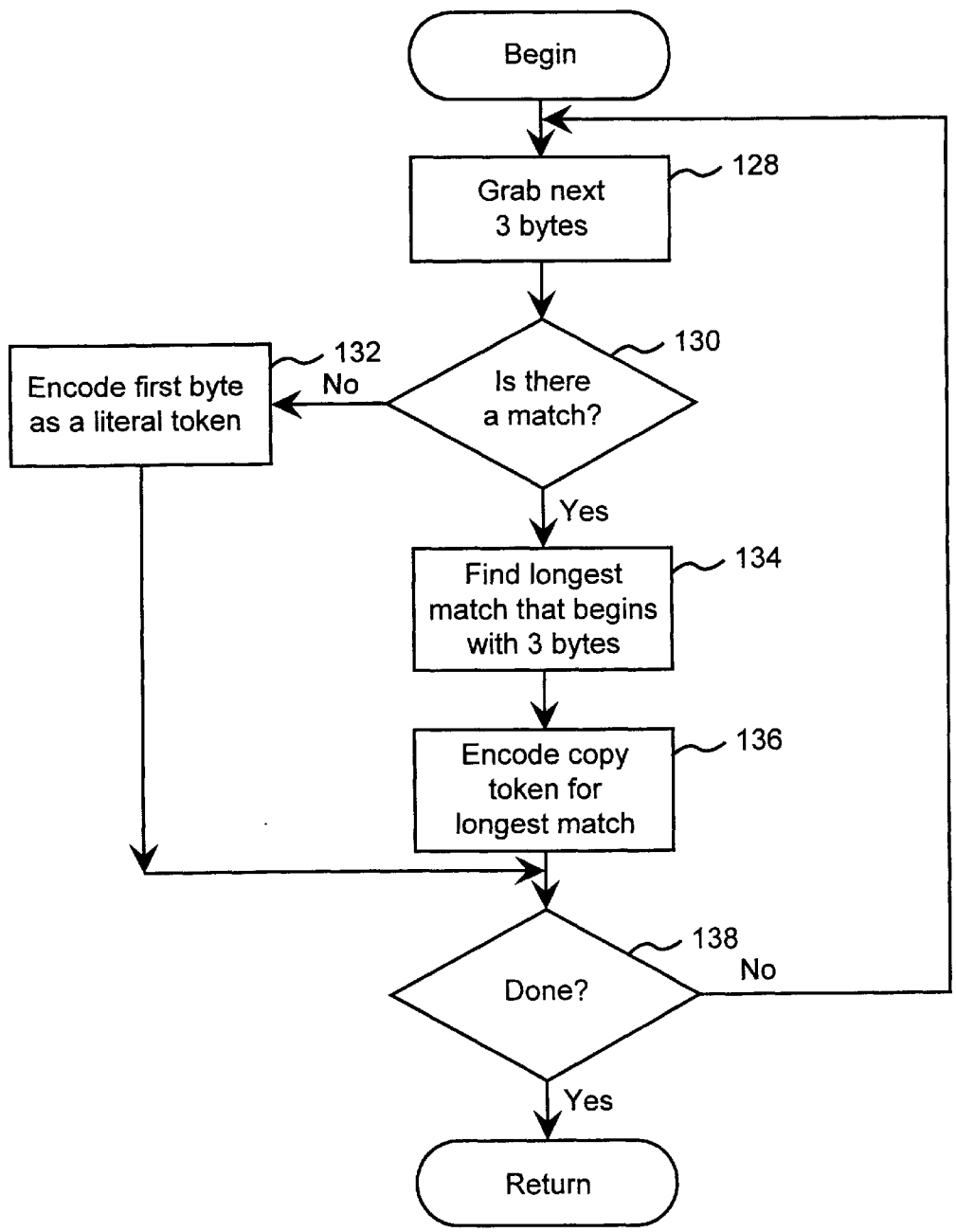
FIG. 13 is a flow chart illustrating the steps that are performed to compress a decompressed chunk of data in accordance with the preferred embodiment of the present invention.

FIG. 12 illustrates an example of the operation of the compression algorithm of the preferred embodiment of the present invention. FIG. 13 illustrates the steps that are performed by the preferred compression algorithm of the present invention. Initially a buffer holds the decompressed data chunk that is to be compressed. A start of buffer (SB) pointer 124 points to the start of the buffer. A current position (CP) pointer 126 points to the location of the byte that is currently being processed. A hash function 114 is used to generate hashes for three byte strings on 12. The resulting hash values serve as indices into hash table 116. As will be described in more detail below, the hash values used to locate a hash table entry 118 that holds a pointer 120.

Figure 1:
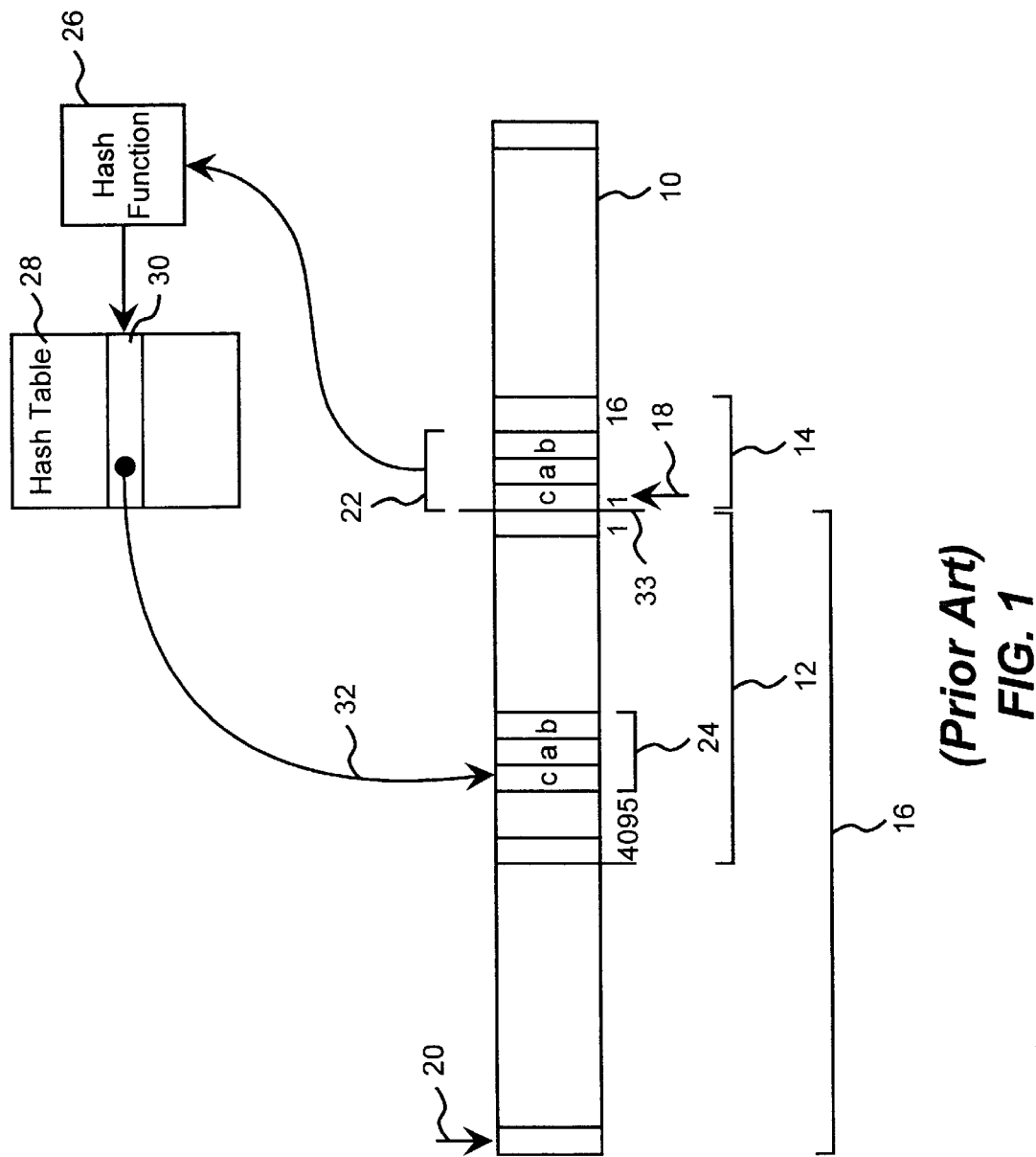
FIG. 1 is a diagram that illustrates operation of a conventional LZRW1 compression algorithm.
Figure 2:
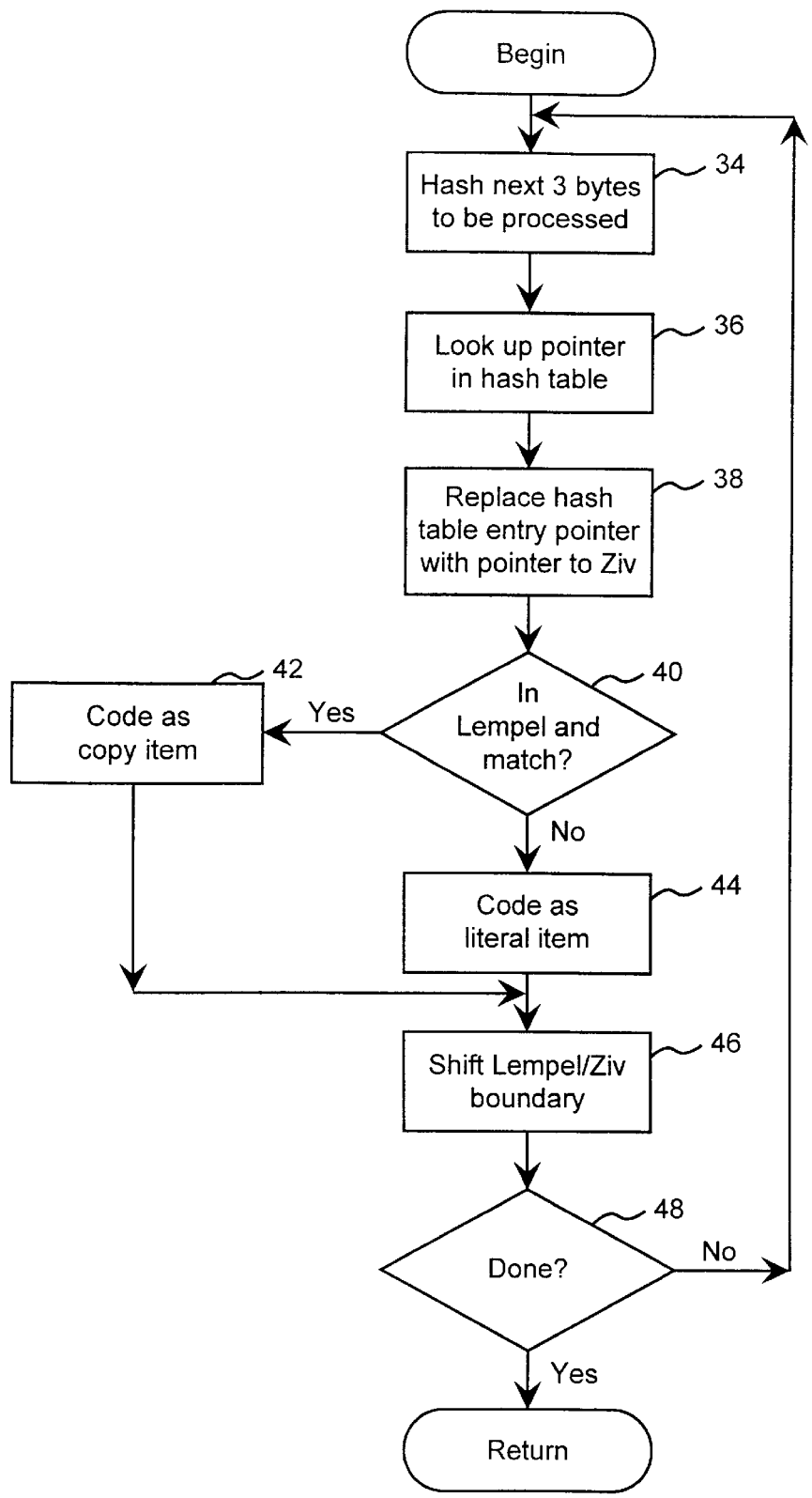
FIG. 2 is a flow chart illustrating the steps that are performed by the conventional LZRW1 compression algorithm.
Figure 3:
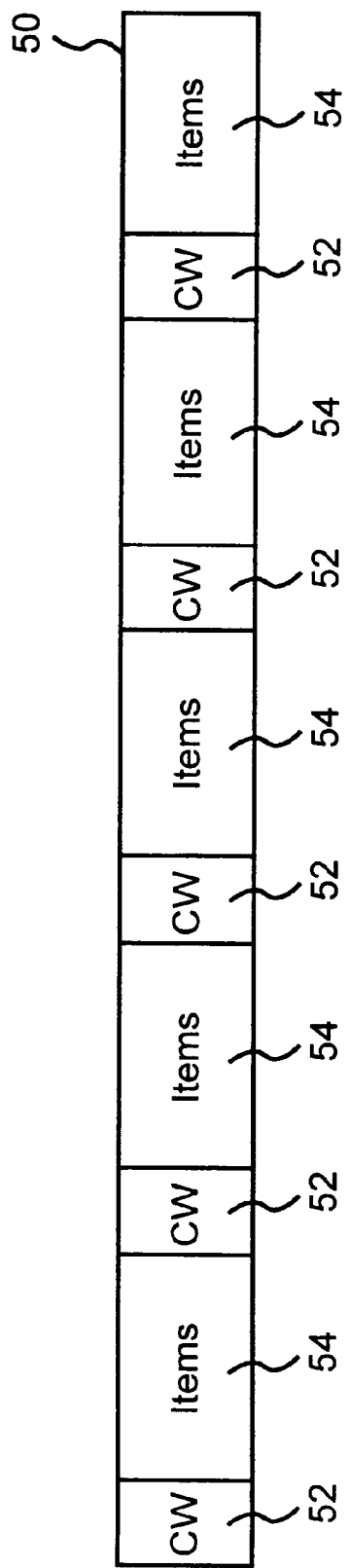
FIG. 3 is a diagram that illustrates the format of a compressed data sequence that is produced by employing the conventional LZRW1 compression algorithm.
Figure 4A:
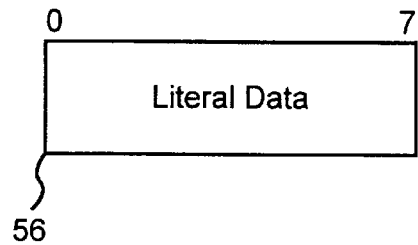
FIG. 4A illustrates the format for a literal item that is produced by applying the conventional LZRW1 compression algorithm.
Figure 4B:
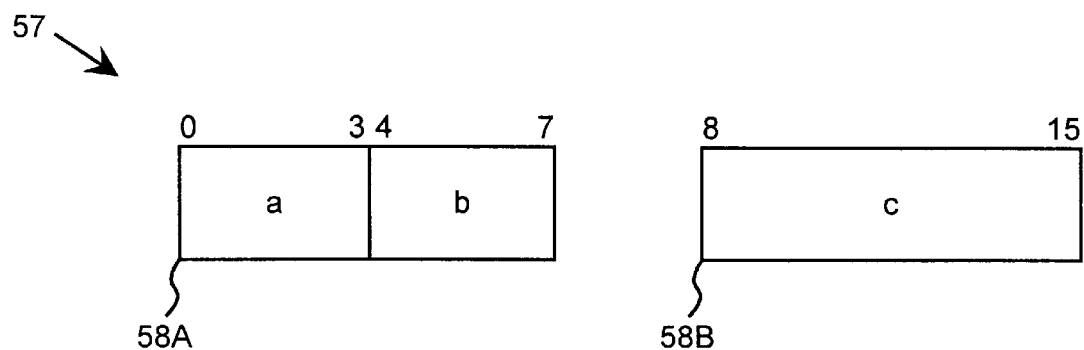
FIG. 4B is a diagram illustrating the format of a copy item that is produced by applying the conventional LZRW1 compression algorithm.

The preferred embodiment of the present invention operates by first grabbing the next three bytes that are to be processed within the decompressed data buffer 110 (step 128 in FIG. 13). In the example shown in FIG. 12, the next three bytes are the next three bytes 112 to be processed that begin at the current position pointer 126. The three bytes 112 are hashed using a hash function 114 to produce a hash value 115 that serves as an index to entry 118 in hash table 116. The hash table entry 118 may hold a pointer 120 that points to a location within the decompressed data buffer 110 or a nil value. If the pointer 120 points to a matching string, a match is found (step 130 in FIG. 13). If the pointer has a nil value or points to a non-matching string, there is no match, and the first byte of the three bytes 112 is encoded as a literal token (step 132 in FIG. 13). Since a hash value is utilized, there is the possibility that the string pointed to by the pointer 120 may be a non-matching string. If a match is found, the longest match that begins with the three bytes 112 is located (step 134 in FIG. 1B). In the example shown in FIG. 12, the match is actually four bytes in length. The match is then encoded as a copy token for the longest match (step 136 of FIG. 13). The system then checks to see whether it is done processing the decompressed data buffer 110 (step 138 in FIG. 13). If the system is not done, it repeats the process beginning with step 128. What next three bytes are grabbed in step 128 depend upon the encoding that just occurred. If a literal token was encoded, the current position pointer 126 is updated to point one position further towards the end of the decompressed data buffer 110. In the example shown in FIG. 12, the current position pointer 126 is shifted to point to "b". If a copy token was encoded, the current position pointer is adjusted to the first byte that follows the last byte that was encoded in the copy token. The next three bytes grabbed in step 128 are the three bytes that begin with the byte to which the current position pointer 126 points.

When the hash function 114 is used to calculate a hash value 115, the hash table entry 118 is updated in a fashion analogous to the LZRW1 algorithm. In particular, the pointer 120 is buffered and the value of a pointer to beginning of the three bytes 112 is stored within the hash table entry 118. Those skilled in the art will appreciate that a two way or four way hash function may be used to accommodate collisions or, alternatively, an exhaustive match function may be used instead of a hash function. When a two way hash function is used, the hash function 114 may produce two hash values that point to two different entries within the hash table 116. These hash table entries may be utilized in a round robin fashion to hold respective pointers. Both pointers may be utilized to determine if there is a match or not.

Figure 14:
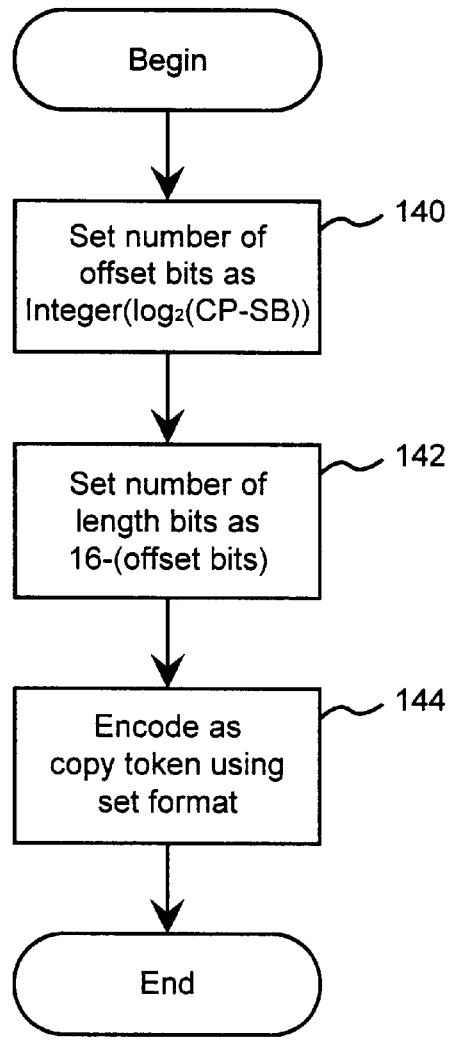
FIG. 14 is a flow chart of the steps that are performed to determine the number of offset bits to be encoded in a copy token.

The encoding of the copy token for the longest match in step 136 of FIG. 13 differs from the encoding of the copy token that is performed by the LZRW1 algorithm. The preferred embodiment of the present invention uses a sliding scale for the number of bits that are allocated to the offset field and length field, as discussed above. FIG. 14 is a flowchart that illustrates the steps that are performed to determine the length of the respective fields. The number of offset bits is calculated to be equal to the integer portion of (the log base 2 of (the current position pointer minus the start of buffer pointer)) (step 140). The number of length bits is then encoded as 16 minus the number of offset bits (step 142). A copy token is then created using this format (step 144).

Figure 15:
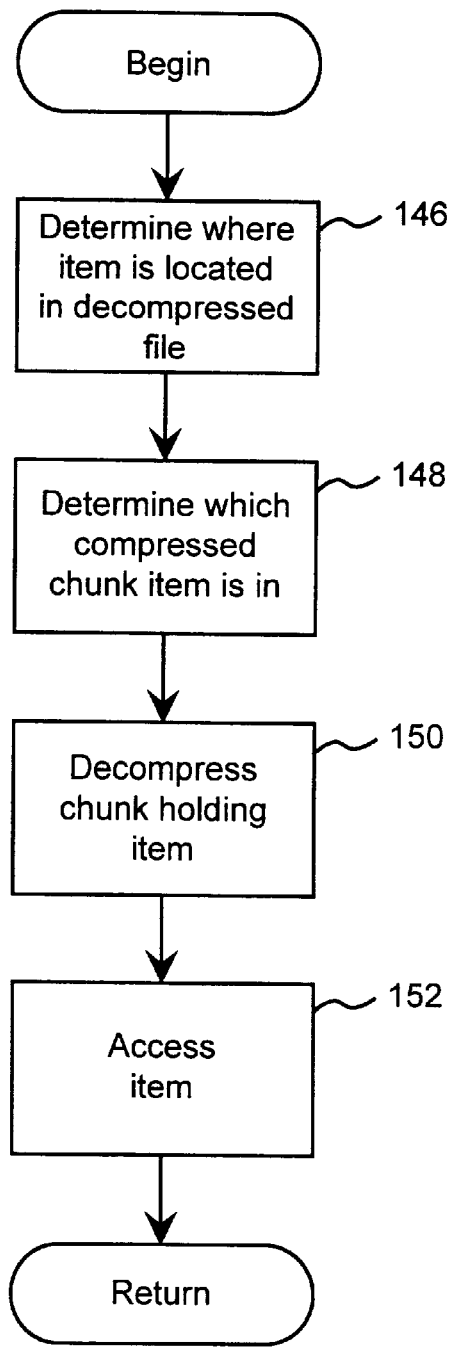
FIG. 15 illustrates the steps that are performed by the preferred embodiment of the present invention to decompress a portion of a compressed file.

As was mentioned above, the compression of chunks of a file independent of other chunks facilitates random access to compressed data upon decompression. One only needs to compress the chunk that holds the data which one wishes to access. There is no need to decompress the entire file. FIG. 15 is a flowchart that illustrates the steps that are performed in such decompression. First, it is determined whether the item is located in the decompressed file (step 146). Based upon this location, it is determined which compressed chunk holds the item (step 148). For example, if a user knew that an item is located in the second 4,096 bytes of a file, the user may then determine that the item rests within the second compressed chunk. The identified compressed chunk is then decompressed (step 150). The decompression is performed in a relatively straightforward manner. Literal tokens are literals and thus do not need to be decompressed. The copy tokens are expanded by determining the literal values to which they refer, and then substituting the literal values in the place of the copy tokens. Once decompression of the chunk is completed, the item may be accessed (step 152).

While the present invention has been described with reference to a preferred embodiment thereof, those skilled in the art will appreciate that various changes in form and detail may be made without departing from the intended scope of the invention as defined in the appended claims. For example, the present invention may be used to compress data other than text. Furthermore, the file may be divided into alternative chunk sizes that differ from 4,096.

I claim:

1. In a computer system, a method for compressing a sequence of data, comprising:

(a) dividing the sequence of data into a series of blocks;

(b) identifying a pattern of data located at a given location in a block that also occurs earlier in the data at a previous location in the block;

(c) encoding the pattern of data at the given location in the block as a copy token having a fixed number of bits, wherein said copy token includes an offset field that identifies an offset between the pattern of data at the given location in the block and the pattern of data at the previous location in the block at which the pattern of data also occurred and wherein how many bits that are included in the offset field depends upon the offset between the given location in the block and the previous location in the block for the pattern of data.

2. The method of claim 1 wherein the number of bits that are included in the offset field are at least equal to a minimum number of bits required to encode an offset from a start of the given location in the block to a start of the data in the block.

3. The method of claim 1 wherein the pattern of data at the previous location in the block must have at least a minimum number of bytes in order for the pattern of data at the given location in the block to be encoded as a copy token.

4. The method of claim 1 wherein the copy token further includes a length field that encodes a length of the pattern of data at the previous location in the block.

5. The method of claim 1 wherein the pattern of data at the previous location in the block includes multiple bytes of data.

6. The method of claim 1 wherein identifying the pattern of data at the given location in the block further comprises:

(a) calculating a hash value of the pattern of data using a hash function;

(b) using the hash value as an index to a hash table to locate a hash table entry; and (c) examining a pointer in the hash table entry to locate the occurrence of the pattern of data at the previous location in the block.

7. In a computer system, a method of compressing a sequence of data into chunks of compressed data, comprising:

(a) dividing the sequence of data into a series of blocks;

(b) processing a first portion of the data at a location in a block to identify at least one sub-sequence of data in the first portion to compress;

(c) determining another sub-sequence of data to be compressed at another location in a second portion of the block;

(d) determining whether at least part of the other sub-sequence of data in the second portion of the block matches at least part of the sub-sequence of data in the first portion of the block;

(e) where at least part of the other sub-sequence of data in the second portion of the block does not match at least part of the sub-sequence of data in the first portion of the block, encoding the not matched part of the other sub-sequence of data in the second portion of the block as a literal token, said literal token being added to a chunk of compressed data that is associated with the block; and (f) where at least part of the other sub-sequence of data in the second portion of the block does match at least part of the sub-sequence of data in the first portion of the block, encoding the matched part of the other sub-sequence of data in the second portion of the block into a copy token with a fixed number of bits that is added to the chunk of compressed data associated with the block the copy token including an offset field that identifies an offset between the other location of the matched part of the other sub-sequence of data in the second portion of the block and the location of the matched part of the sub-sequence of data in the first portion of the block, and a length field that identifies a length of the matched part of the sub-sequence of data in the first portion of the block, wherein how many bits are in the offset field depends on the position of the matched part at the other location of the other sub-sequence of data in the second portion of the block.

8. The method of claim 7 wherein a number of bits in the offset field equals a minimum number of bits required to encode an offset from a start of the matched part of the other sub-sequence of data in the second portion of the block to a start of the matched part of the sub-sequence of data in the first portion of the block.

9. The method of claim 7 wherein the matched part of the other sub-sequence of data in the second portion of the block includes at least a threshold quantity of data in order for the matched part of the other sub-sequence of data in the second portion of the block to be encoded as the copy token.

10. The method of claim 9 wherein the matched part of the other sub-sequence of data in the second portion of the block includes multiple bytes of data.

11. The method of claim 7 wherein the sub-sequence of data in the first portion of the block is a contiguous sub-sequence of data.

12. In a computer system, a method of compressing a file comprising pieces of data, comprising:

(a) dividing the file into blocks of data;
(b) separately compressing each block of data into a chunk of compressed data by performing the following:
  (i) sequentially examining each sub-sequence of data in each block of data;
  (ii) encoding each subsequent sub-sequence of data in a block that is over a minimum threshold length and that has occurred previously in the block as a copy token of a predetermined number of bits, each copy token including an offset field that specifies an offset between the subsequent occurrence of the sub-sequence of data at a location in the block and another location in the block that the sub-sequence of data first occurred and a length field that specifies a length of the first occurrence of the sub-sequence of data at the other location in the block, wherein how many bits are used in the offset field depends on the location of the subsequent occurrence of the sub-sequence of data within the block; and
  (iii) encoding each sub-sequence of data in the block, that is not encoded as a copy token, as a literal token in the compressed chunk.

13. The method of claim 12, further comprising:
(a) for each chunk of compressed data, aggregating the copy tokens and the literal tokens into at least one group of sequentially contiguous tokens, each group of sequentially continuous tokens including at most a predetermined number of the copy tokens and the literal tokens; and
(b) adding a mask to each chunk of compressed data for each group of sequentially contiguous tokens wherein the mask is associated with the group and identifies each token in the group as a literal token or a copy token.

14. The method of claim 13 wherein each literal token and each copy token for each group has a corresponding bit in the mask that is associated with the group.

15. The method of claim 13 wherein each associated mask is at least a byte in length.

16. In a computer system, a method of compressing a sequence of blocks of data, comprising the computer-implemented steps of:

(a) compressing a first sub-sequence of data at a first location in a block of data by encoding the first sub-sequence of data as a first copy token having a fixed number of bits, said first copy token including an offset field that has a first number of bits and that encodes an offset between the first location and a previous occurrence of the first sub-sequence of data in the block of data; and
(b) compressing a second sub-sequence of data at a second location in the block of data as a second copy token having the fixed number of bits, said second copy token having another offset field that has a second number of bits that differs from the first number of bits and that encodes an offset between the second location in the block of data and a previous occurrence of the second sub-sequence of data in the block of data.

17. The method of claim 16 wherein the first number of bits in the offset field of the first copy token equals at least a minimum number of bits required to produce an offset between the first sub-sequence of data and a beginning of the block of data.

18. The method of claim 16 wherein the second number of bits in the other offset field of the second copy token equals at least a minimum number of bits required to encode an offset between the second sub-sequence of data and a beginning of the block of data.

19. In a computer system, a method of decompressing an item in a chunk of a compressed file having a number of separate chunks, comprising:

(a) identifying which chunk of the compressed file holds the item, said identified chunk including like-sized copy tokens and also including literal tokens;
(b) decompressing the chunk of the compressed file that has been identified as holding the item while keeping other chunks compressed, said decompressing comprising:
  (i) identifying a first of the copy tokens that encodes a current sub-sequence of data that includes the item, said first copy token including an offset field that specifies an offset between the current sub-sequence of data and a previous occurrence of the sub-sequence of data that is included in a sequence of literal tokens;
  (ii) identifying how many bits are in the offset field by identifying a location of a first of the sequence of literal tokens that encode the previous occurrence of the sub-sequence of data; and
  (iii) decompressing the first copy token by replacing the first copy token with the previous occurrence of the sub-sequence of data that the sequence of literal tokens encode.

20. In a computer system, a method of decompressing a sequence of chunks of compressed data containing copy tokens and literal tokens, wherein the copy tokens each contain an offset field and a number of bits in the offset field that depends upon a location in a sequence of data prior to compressing the sequence of data into the sequence of chunks of compressed data, said method comprising:

for each of the copy tokens,
- (i) identifying a number of bits in the offset field by determining a location of a sub-sequence of data prior to encoding by the copy token;
- (ii) using the identified offset field to locate the sub-sequence of data that is encoded by the copy token;
- (iii) replacing the copy token with the sub-sequence of data that is encoded by the copy token; and for each literal token, keeping the literal token in the sequence.

21. A computer system comprising:
(a) a storage for storing a sequence of data; and
(b) a compression engine for compressing the sequence of data into at least one chunk of compressed data that includes a sequence of copy tokens and literal tokens, each copy token encoding a sub-sequence of data as a copy of a like sub-sequence of data that has previously occurred in the sequence of data and each literal token encoding a literal piece of data wherein each copy token is of like size and includes a variable-sized offset field having a number of bits that is based on the location of the sub-sequence encoded by the copy token in the sequence of data.

22. The computer system of claim 21 wherein the compression engine further comprises:
(a) a token grouper for grouping sequentially occurring literal tokens and copy tokens into groups in the compressed block; and
(b) a mask generator for generating a mask for each group, each bit in each mask corresponding to one of the literal tokens or the copy tokens in the group and identifying each corresponding token as a literal token or a copy token.

23. A computer system comprising:
(a) a storage for storing at least one chunk of compressed data, each chunk of compressed data including copy tokens that encode copies of previously occurring sub-sequences of data and literal tokens that literally encode pieces of data, wherein the copy tokens are all of a like size and include a variable-length offset field that encodes an offset to a previous occurrence of the sub-sequence of data; and
(b) a decompression engine for decompressing each chunk of compressed data into a decompressed sequence of data, said decompression engine including a copy token decompressor for decompressing the copy tokens, said copy token decompressor identifying how many bits are in the offset fields of each copy token based on a location of the previous occurrence of the sub-sequence of data prior to encoding as the copy token.

24. A computer-readable storage media comprising:
a compression engine for compressing a sequence of data into at least one chunk of compressed data, each chunk including a sequence of copy tokens and literal tokens, each copy token encoding a sub-sequence of data as a copy of an identical sub-sequence of data that has previously occurred in the decompressed sequence of data and each literal token encoding a literal piece of data wherein each copy token is of like size and includes a variable-sized offset field having a number of bits that is based on a location in the sequence of data of a subsequent occurrence of the identical sub-sequence of data prior to the encoding of the subsequent occurrence of the identical sub-sequence as the copy token.

25. A computer-readable storage media comprising:
a decompression engine for decompressing a chunk of compressed data into a block of data, said decompression engine including a copy token decompressor for decompressing the copy tokens, said copy token decompressor identifying how many bits are in the offset fields of each copy token based on a previous location in the data of an identical sub-sequence of data prior to the encoding of a subsequent occurrence of the identical sub-sequence of data as the copy token.

26. In a computer system, a method for compressing a sequence of data, comprising:
(a) dividing the sequence of the data into a series of consecutive blocks, each block having a predetermined amount of data;
(b) compressing each block of data into a chunk of compressed data, the compression of a block of data comprising:
- (i) sequentially examining data in the block to identify a pattern of data;
- (ii) encoding a copy token to represent each subsequent occurrence of each pattern in the block of data that has initially occurred at a previous location in the block of data;
- (iii) encoding a literal token to represent each initial occurrence of each pattern in the block of data; and
- (iv) producing a sequence of each literal token and each copy token.

27. The method of claim 26, wherein the dividing of the sequence of the data into a series of consecutive blocks, further comprises selecting a size for the predetermined amount of data in each block so that the compression of the sequence of data is optimized.

28. The method of claim 26, further comprises decompressing each chunk of compressed data, comprising:
(a) replacing each literal token with the initial occurrence of the pattern in the block of data that is represented by the literal token; and
(b) replacing each copy token with the subsequent occurrence of the pattern in the block of data that is represented by the copy token, so that the sequence of data is reproduced from the chunks of compressed data.

29. The method of claim 28, wherein decompressing each chunk of compressed data, further comprises enabling decompression of each chunk of compressed data that includes an item and not decompressing each chunk of compressed data that does not include the item, so that random access to the item in the compressed data is provided to a user.

30. The method of claim 29, wherein the dividing of the sequence of the data into a series of consecutive blocks, further comprises selecting a size for the predetermined amount of data in each block so that random access to the item is optimized.

31. The method of claim 26, wherein the subsequent occurrence of the pattern in the block of data that has initially occurred at the previous location in the block of data has a length of at least three bytes.

32. The method of claim 26, wherein the copy token further comprises an offset field that identifies an offset between the subsequent occurrence of the pattern in the block of data and the initial occurrence of the pattern in the block of data.

33. The method of claim 32, wherein the offset field contains the minimum amount of bits required to encode the offset between a start of the subsequent occurrence of the pattern in the block of data and a start of the block of data.

34. The method of claim 26, wherein sequentially examining data in the block to identify a pattern of data further comprises:

(a) calculating a hash value of the pattern using a hash function;

(b) using the hash value as an index to a hash table to locate a hash table entry; and (c) examining a pointer in the hash table entry to locate the occurrence of the pattern at the previous location in the block of data.

\* \* \* \* \*

UNITED STATES PATENT AND TRADEMARK OFFICE
CERTIFICATE OF CORRECTION

PATENT NO. : 5,933,104
DATED : August 3, 1999
INVENTOR(S) : G.D. Kimura

Page 1 of 2

It is certified that error appears in the above-identified patent and that said Letters Patent is hereby corrected as shown below:

| COLUMN | LINE | |
|---|---|---|
| 1 | 9 | after "and," delete "." |
| 1 | 15 | "Ziu" should read --Ziv-- |
| 1 | 16 | after "Compression," insert --"-- |
| 4 | 10 | after "format of" insert --the-- |
| 6 | 48 | after "hash values" insert --are-- |
| 7 | 21 | after "pointer to" insert --the-- |
| 9 (Claim 7, | 12 line 30) | after "block" insert --,-- |
| 12 (Claim 29, | 51 line 2) | after "data" delete "," |

UNITED STATES PATENT AND TRADEMARK OFFICE
CERTIFICATE OF CORRECTION

PATENT NO. : 5,933,104
DATED : August 3, 1999
INVENTOR(S) : G.D. Kimura

It is certified that error appears in the above-identified patent and that said Letters Patent is hereby corrected as shown below:

COLUMN　　LINE

12　　　　　58　　　after "blocks" delete ","
(Claim 30, line 2)

Signed and Sealed this

Ninth Day of May, 2000

*Attest:*

Q. TODD DICKINSON

*Attesting Officer*　　　　*Director of Patents and Trademarks*